US006106892A

United States Patent [19]

Ye

[11] Patent Number: 6,106,892

[45] Date of Patent: Aug. 22, 2000

[54] DEPOSITION OF SILICON OXIDE COATING ON GLASS

[75] Inventor: Liang Ye, Southport, United Kingdom

[73] Assignee: Pilkington Plc, United Kingdom

[21] Appl. No.: 09/082,392

[22] Filed: May 20, 1998

[30] Foreign Application Priority Data

May 23, 1997 [GB] United Kingdom .................. 9710547

[51] Int. Cl.[7] .............................. B05D 5/12; C23C 16/40

[52] U.S. Cl. .............. 427/109; 427/255.18; 427/255.37; 427/314; 65/60.8

[58] Field of Search ................................ 427/248.1, 314, 427/255.1, 255.2, 109, 255.18, 255.37; 65/60.8

[56] References Cited

U.S. PATENT DOCUMENTS

| | | | |
|---|---|---|---|
| 5,028,566 | 7/1991 | Lagendijk . | |
| 5,089,039 | 2/1992 | Terneu et al. | 65/60.5 |
| 5,395,698 | 3/1995 | Neuman et al. | 428/428 |
| 5,401,305 | 3/1995 | Russo et al. . | |
| 5,599,387 | 2/1997 | Neuman et al. . | |

FOREIGN PATENT DOCUMENTS

| | | |
|---|---|---|
| 09-246267 | 9/1997 | Japan . |
| 93/12892 | 7/1993 | WIPO . |
| 93/12934 | 7/1993 | WIPO . |

OTHER PUBLICATIONS

Rojas et al, J. Vac. Sci. Technol. B11 (6) Nov./Dec. 1993, pp. 2081–2089.

A.K. Hochberg and D. L. O'Meara, The LPCVD of Silicon Oxide Films Below 400 C From Liquid Sources, 1046 Journal of the Electropchemical Society 136 (1989) Jun., NR. 6, Manchester, NH, US, pp. 1843–1844.

The Deposition of Borophosphosilicate Glass Films By LPCVD Using 2,4, 6,8 Tetramethylcyclotetrasiloxane, O'Meara, Mat. Res. Soc. Symp. Proc., vol. 204, 204 (1991 no month data), pp. 533–538.

*Primary Examiner*—Roy V. King
*Attorney, Agent, or Firm*—Marshall & Melhorn

[57] ABSTRACT

A method of depositing a silicon oxide coating on a hot glass substrate by chemical vapor deposition which comprises contacting the substrate with a silane and a phosphorus or boron ester, for example, triakylphosphite or trialkylborate, preferably triethylphosphite. Preferably, the method is performed during the formation of glass by the float glass production process.

7 Claims, No Drawings

DEPOSITION OF SILICON OXIDE COATING ON GLASS

FIELD OF THE INVENTION

The invention relates to the deposition of a silicon oxide coating by chemical vapour deposition (CVD).

DESCRIPTION OF THE PRIOR ART

It is known to deposit silicon oxide coatings by CVD on hot glass using a mixture of silane and oxygen. UK patent GB 2 234 264B describes such a technique in which a venturi is used to provide an intimate admixture of silane and oxygen which is then directed on to the hot glass. It is suggested that forming an intimate admixture of the two gases alleviates the problems of premature reaction and powder formation which would otherwise occur, but the reaction system remains difficult to control with a serious risk of powder formation, fire or even explosion.

A prior method of producing a silicon oxide coating, disclosed in European patent specification 0 275 662A, avoided the use of oxygen gas by using a gaseous mixture of silane, an electron donating compound, for example ethylene, and carbon dioxide, to deposit the silicon oxide coating on hot glass. The presence of the ethylene in conjunction with silane appeared, for reasons not well understood, to result in the incorporation of oxygen from the glass in the coating, while the carbon dioxide provided additional oxygen enabling a more highly oxidised coating to be obtained; in addition to silicon and oxygen, the resulting coatings contained significant amounts of carbon, and may be referred to either as silicon oxide containing carbon, or silicon oxycarbide. An analogous method, disclosed in European patent specification EP 0 348 185A used alternative oxygen containing compounds in place of the carbon dioxide.

While these two methods avoided any problems inherent in the use of oxygen, and have proved perfectly adequate for certain applications, it has proved difficult to obtain the high coating growth rates desirable for certain products (especially products having a high proportion of oxygen to silane in order to provide a refractive index equal to or less than that of the bulk glass).

European patent application 0 611 733A2 relates to a method of depositing a mixed metal oxide coating (e.g. a mixture of tin oxide and silicon oxide) on hot glass by directing a gaseous mixture of metal oxide precursors on to the hot glass; a coating having a composition which varies continuously with the distance from the substrate-coating interface is produced by a technique which involves moving first and second portions of the gaseous mixture in opposite directions over the glass surface.

When one of the oxides is silicon oxide, the metal oxide precursor used to deposit it may be silane or diethylsilane but is usually a silicon compound containing at least one and preferably several direct silicon-oxygen bonds, and a number of the claims are directed to (presumably as novel coating composition) certain coating compositions including compounds incorporating such silicon-oxygen bonds. The specification discloses that a wide range of accelerants including Lewis acids, Lewis bases, water, and compounds of nitrogen, phosphorus, boron and sulphur (having specified structural formula encompassing alkyl phosphites and alkyl borates) may be used to increase the rate of deposition of silicon oxide, alone or preferably in combination with another oxide, from the precursor; and the Examples show the use of accelerants in depositing silicon oxide from silicon compounds containing direct oxygen-silicon bonds.

International patent applications WO 93/12892, WO 93/12934 and WO 93/13393 also relate to a method of depositing a mixed fin oxide silicon oxide film from a tin oxide precursor and a silicon oxide precursor containing at least one silicon to oxygen bond, and proposes the use of phosphite and borate derivatives, especially phosphorus and boron esters, to accelerate the deposition of the mixed oxide films.

The mixed oxide films described in European patent application 0 611 733A2 and the international applications referred to above are normally non-stoichiometric, containing significantly less oxygen than required to satisfy the valency (IV) of tin in stannic oxide and silicon (IV) in silica.

BRIEF SUMMARY OF THE INVENTION

We have now found that silicon oxide coatings may be deposited on hot glass by CVD at high growth rates (and, if desired, with high proportions of oxygen to silicon and consequent low refractive indices), while avoiding significant powder formation by prereaction before the gaseous mixture reaches the glass, by using a gaseous mixture of a silane (which is free from direct silicon oxygen bonds) and a phosphorus or boron ester, and with surprisingly little incorporation of phosphorus or boron in the coating.

According to the present invention, there is provided a method of depositing a silicon oxide coating on a hot glass substrate by chemical vapour deposition which comprises contacting the substrate with a silane and a phosphorus ester or boron ester.

The process of the present invention is especially useful for applying a silicon oxide coating to hot glass, and, being suitable for use at substantially atmospheric pressure, may be applied advantageously to a hot glass ribbon during the glass production process. The process is preferably operated at a glass ribbon temperature of over 500° C., especially a temperature of about 600° C. or above.

DETAILED DESCRIPTION OF THE PREFERRED EMBODIMENTS OF THE INVENTION

In a preferred process, a gaseous mixture of a silane and the ester is formed and the mixture directed towards the hot substrate. Despite the accelerant effect of the ester, premixing of the silane and other gaseous reactants (such as an alkene, e.g ethylene, and a gaseous source of combined oxygen e.g. $CO_2$) does not result in significant undesirable prereaction, even when the highly reactive monosilane is used as the silane, permitting a laminar flow process (since there is no need to mix the reactants over the glass) to be used.

The silane is conveniently monosilane, $SiH_4$, although other substituted or unsubstituted silanes in gaseous form, for example organo silicones such as dimethylsilane $(CH3)_2SiH_2$, and chlorosilanes such as dichlorosilane $SiH_2Cl_2$ as well as disilane $Si_2H_6$, m be used if desired. However, by far the best results, and greatest growth rate (as well as the greatest increase in growth rate resulting from incorporation of the accelerant) have been observed using monosilane.

The invention is illustrated but not limited by the following Examples, in which all gas volumes are stated under standard conditions (room temperature, i.e. approximately 20° C. and 1 atmospheric pressure) unless otherwise indicated.

EXAMPLES 1–7

In each of this series of Examples, a gaseous mixture is prepared preheated to a temperature of 100° C. and passed over a static substrate of 4 mm thick clear float glass of area approximately 50 square centimeters heated to 660° C. on a graphite heater in a silica tube. The gaseous mixtures used were as shown in Table 1. Where used, the accelerant, a phosphite or borate ester, was injected into the heated gaseous mixture at the rate stated in the Table. Deposition was continued for 15 seconds (except in Example 5 where deposition was continued for 40 seconds) after which the flow of reactant gases was shut off and the samples allowed to cool under a flow of nitrogen.

After cooling the coated samples were removed, and thickness and refractive indices of the coatings measured. The coatings were also analysed for silicon, oxygen, carbon, phosphorus and boron by Auger electron spectroscopy. The results obtained are reported in Table 2.

Comparing Example 1 with comparative example 1 shows the effect of adding triethylphosphite to the gaseous mixture of silane, ethylene and carbon dioxide taught in EP 0 275 662A. Adding the phosphite ester increases the deposition rate of silicon oxide by a factor of 7 (Table 1, final column), while substantially reducing, from 35% to 1%, the amount of carbon incorporated in the coating, and surprisingly increasing the ratio of oxygen : silicon in the coating to 2. These changes result in a reduction of the refractive index of the coating from 1.72 to 1.48.

Example 2 shows that, when the phosphite ester is present, omitting the carbon dioxide has only a very limited effect on the growth rate, composition and refractive index of the coating, although comparative example 2 confirms that, in the absence of- the phosphite ester, inclusion of carbon dioxide has a significant effect on the composition and refractive index of the coating.

Similarly, Example 3 and comparative example 3 show that, while use of ethylene is important to increasing the oxygen to silicon ratio and reducing the refractive index in the absence of the phosphite ester, use of the phosphite ester enables high growth ratio and oxygen to silicon ratio, with low refractive index (<1.5), to be achieved even in the absence of ethylene.

Example 4 shows that, when the phosphite ester is used, omitting the carbon dioxide and ethylene has only a minor detrimental effect on the growth rate and refractive index of the coating (comparing Examples 1 and 4).

Example 5 shows a similar high performance can be achieved when the monosilane of Example 1 is replaced by a halo substituted silane, dichlorosilane.

Example 6 shows that trimethylphosphite is almost as effective as the triethylphosphite used in Example 1, while Example 7 shows that a borate may also be used. All the Examples show a surprisingly low rate (≦4%) of incorporation of phosphorus into the coating.

TABLE 1

| Example | Silane[1] liters/minute | $C_2H_4$ liters/minute | $CO_2$ liters/minute | $N_2$ liters/minute | Accelerant ml/minute | Film thickness nm | Deposition rate nm/second |
|---|---|---|---|---|---|---|---|
| 1 | 0.08 | 1.5 | 1 | 4 | 0.8 TEP[2] | 270 | 18 |
| comparative 1 | 0.08 | 1.5 | 1 | 4 | — | 38 | 2.5 |
| 2 | 0.08 | 1.5 | — | 4 | 0.8 TEP[2] | 255 | 17 |
| comparative 2 | 0.08 | 1.5 | — | 4 | | 75 | 3.5 |
| 3 | 0.08 | — | 1 | 4 | 0.8 TEP[2] | 240 | 16 |
| comparative 3 | 0.08 | — | 1 | 4 | — | 100 | 6.7 |
| 4 | 0.08 | — | — | 4 | 0.8 TEP[2] | 202 | 14 |
| 5 | 1.6 DCS (5% in He) | 1.5 | 1 | 4 | 0.8 TEP[2] | 100 | 2.5 |
| comparative 5 | As5 | 1.5 | 1 | 4 | — | 25 | 0.6 |
| 6 | 0.08 | 1.5 | 1 | 4 | 0.8 TMP[3] | 260 | 17.3 |
| 7 | 0.08 | 1.5 | 1 | 4 | 0.8 TEP[2] + 0.8 TEB[4] | 145 | 9.7 |

[1]Monosilane is used as the silane in all Examples except Example 5 when dichlorosilane $SiH_2Cl_2$ (DCS) is used in helium carrier gas.
[2]TEP—triethylphosphite.
[3]TMP—trimethylphosphite
[4]TEB—triethylborate

TABLE 2

| Example | Refractive Index | Chemical Composition in atomic % Si | O | C | P | B |
|---|---|---|---|---|---|---|
| 1 | 1.48 | 32 | 64 | 1 | 2.5 | — |
| comparative 1 | 1.72 | 25 | 40 | 35 | — | — |
| 2 | 1.47 | 32 | 63 | — | 4 | — |
| comparative 2 | 2.16 | 35 | 12 | 50 | — | — |
| 3 | 1.47 | 32 | 64 | — | 3 | — |
| comparative 3 | 2.39 | 43 | 35 | 22 | — | — |
| 4 | 1.47 | 34 | 61 | 2.5 | 2 | — |
| 5 | 1.47 | 25 | 70 | 2 | 3 | — |
| comparative 5 | 1.6 | 28 | 63 | 8 | — | — |
| 6 | 1.47 | 26 | 70 | 1.5 | 2.5 | — |
| 7 | 1.47 | 34 | 60 | 4 | 1 | 1 |

EXAMPLES 8–25

In this series of Examples, a silicon oxide coating was applied to a moving ribbon of clear float glass 1.1 mm thick during the glass production process, using a laminar flow coating process as described and illustrated in UK patent 1 507 996 B, with a coating chamber opening onto the glass from above having a length of 150 mm in the direction of ribbon advance. The glass under the coating was a temperature of about 630° C.

Coating gases comprising 0.35 liters per minute of monosilane in admixture with ethylene, $CO_2$, TEP in $N_2$ and additional $N_2$, at the flow rates shown in Table 3 were passed through the coating chamber in turn. The TEP in nitrogen was provided by bubbling nitrogen at the indicated flow rate through a bubbler containing liquid triethylphosphite at 100° C. In each case, the glass ribbon speed was as shown in the Table.

Each of the Examples resulted in the formation of a coating on the glass ribbon and, in each case, the rate of growth of the coating is shown in the final column of Table 3. Table 4 sets out the results of analyses and measurements of refractive index on selected coatings, with each of the coatings analysed having an oxygen:silicon ratio of about 2, with up to 3% phosphorus incorporation, while all the refractive index measurements gave values below 1.5. The different coating rates achieved with the different gas mixtures used are indicated in the final column of Table 3.

Example 8, employing a mixture consisting of monosilane, triethylphosphite and nitrogen, shows the highest rate of coating deposition (167 nm per second) with an oxygen:silicon ratio of about 2 in the resultant coating. Adding ethylene and carbon dioxide, as taught in the prior art, with a corresponding increase in the total flow rate, actually reduces the coating rate (80 nm per second in Example 9). Examples 10 to 13, in which the flow rate of triethylphosphite is varied while adjusting the nitrogen flow rate to keep the total flow rate constant, show no clear trend, and the apparent inconsistency between Examples 9 and 12 (different coating rates using the same gas mixture at the sale flow rate) indicates that care is required in interpreting the results.

Examples 14 to 17 in which the ethylene flow rate is varied while maintaining silane, carbon dioxide and alkylphosphate flow rates constant, and adjusting the nitrogen flow rate to maintain the total flow rate constant, indicate the effect of adding ethylene in the presence of the alkylphosphate is to reduce the coating rate. Comparing Examples 16 and 18 suggests this effect of ethylene in reducing coating rate is reduced at increased flow rate, lending support to a theory that, in the presence of the alkylphosphite, the ethylene acts primarily as an etchant.

Examples 18 to 20 show the effect of varying ethylene:carbon dioxide ratio while maintaining other flows constant and suggest highest deposition rates may be achieved with a ratio of ethylene:carbon dioxide of 1:1 (although this is difficult to reconcile with the earlier conclusion that increasing ethylene concentration reduces the coating rate). Comparing Examples 18 and 21 (in which the only difference is an increased flow of nitrogen diluent) suggests that increasing the total flow rate, while maintaining the flow of active reactants constant, reduces the coating rate, while Examples 23 to 25 generally confirm the limited importance of the ethylene and carbon dioxide when the alkylphosphite is used.

While specific effects are difficult to determine, generally these examples show that a high deposition rate may be achieved by adding an alkylphosphite to the silane (without the need to use either ethylene or carbon dioxide ), and that the resultant coatings have a composition approximately that of $SiO_2$ (evidenced, in the case of Examples 18 to 25, by the low refractive indices of the coatings produced). Moreover, the Examples all show that the beneficial results of the invention may be achieved without the need to add oxygen (and incur the consequent increased risk of prereaction) to the reactant gases used.

TABLE 3

| Example | ribbon speed meters/hour | $C_2H_4$ liters/minute | $CO_2$ liters/minute | $N_2$ TEP liters/minute | $N_2$ liters/minute | Film thickness nm | Deposition rate nm per second |
|---|---|---|---|---|---|---|---|
| 8 | 360 | 0 | 0 | 1.25 | 2.5 | 250 | 167 |
| 9 | 360 | 1.2 | 1.5 | 1.25 | 2.5 | 120 | 80 |
| 10 | 360 | 1.2 | 1.5 | 0.5 | 3.25 | 75 | 50 |
| 11 | 360 | 1.2 | 1.5 | 1.0 | 2.75 | 70 | 47 |
| 12 | 360 | 1.2 | 1.5 | 1.25 | 2.5 | 75 | 50 |
| 13 | 360 | 1.2 | 1.5 | 2 | 1.75 | 80 | 53 |
| 14 | 360 | 0.25 | 1.5 | 1.25 | 3.45 | 83 | 55 |
| 15 | 360 | 0.75 | 1.5 | 1.25 | 2.95 | 80 | 53 |
| 16 | 360 | 1.5 | 1.5 | 1.25 | 2.25 | 70 | 47 |
| 17 | 360 | 3 | 1.5 | 1.25 | 0.7 | 55 | 37 |
| 18 | 388 | 1.5 | 1.5 | 1.25 | 3 | 100 | 72 |
| 19 | 388 | 2.5 | 1 | 1.25 | 2.5 | 70 | 50 |
| 20 | 388 | 1 | 2.5 | 1.25 | 2.5 | 70 | 50 |
| 21 | 388 | 1.5 | 1.5 | 1.25 | 5 | 66 | 47 |
| 22 | 388 | 1.5 | 1.5 | 2 | 2.5 | 85 | 61 |
| 23 | 388 | 3 | 0 | 1.25 | 3 | 80 | 57 |
| 24 | 388 | 0 | 3 | 1.25 | 3 | 81 | 58 |
| 25 | 388 | 0 | 0 | 1.25 | 5 | 83 | 60 |

TABLE 4

| | | Chemical Composition | | | |
|---|---|---|---|---|---|
| | | | atomic | % | |
| Example | Ref Index | Si | O | C | P |
| 8 | | 31 | 64 | 1 | 3 |
| 9 | | | | | |
| 10 | | 32 | 64 | 1.5 | 2 |
| 11 | | 32 | 64 | 2 | 2 |
| 12 | | 33 | 65 | 0.5 | 1.5 |
| 13 | | 32 | 63 | 2 | 3 |
| 14 | | 32 | 63 | 1.5 | 3 |
| 15 | | | | | |
| 16 | | | | | |
| 17 | | | | | |
| 18 | 1.45 | | | | |
| 19 | 1.45 | | | | |
| 20 | 1.47 | | | | |
| 21 | 1.47 | | | | |
| 22 | 1.46 | | | | |
| 23 | 1.47 | | | | |
| 24 | 1.46 | | | | |
| 25 | 1.47 | | | | |

What is claimed is:

1. A method of depositing a silicon oxide coating on a hot glass substrate by chemical vapor deposition which comprises:

providing the hot glass substrate, forming a gaseous mixture comprising a silane and an ester selected from the group consisting essentially of a phosphorus ester and a boron ester, directing the gaseous mixture towards the hot glass substrate, and contacting the substrate with the gaseous mixture at substantially atmospheric pressure, thereby depositing the silicon oxide coating on the hot glass substrate, wherein the deposited silicon oxide coating has a refractive index not greater than 1.5.

2. A method according to claim 1 wherein the phosphorus ester is a trialkylphosphite.

3. A method according to claim 1 wherein the boron ester is a trialkylborate.

4. A method according to claim 1 wherein the hot glass substrate comprises a hot glass ribbon and wherein the hot glass ribbon is contacted with the silane and the ester during the glass production process.

5. A method according to claim 1 wherein the hot glass substrate comprises a hot glass ribbon and wherein the hot glass ribbon is contacted with the silane and the ester when the glass is at a temperature of over 500° C.

6. A method according to claim 2 wherein the trialkylphosphite comprises triethylphosphite.

7. A method according to claim 1 wherein monosilane is used as the silane.

* * * * *

UNITED STATES PATENT AND TRADEMARK OFFICE

CERTIFICATE OF CORRECTION

PATENT NO. : 6,106,892
DATED : August 22, 2000
INVENTOR(S) : Liang Ye

It is certified that error appears in the above-identified patent and that said Letters Patent is hereby corrected as shown below:

Column 5,
Lines 52-53, delete “alkylphosphate” and replace with -- alkylphosphite --.
Lines 55-56, delete “alkylphosphate” and replace with -- alkylphosphite --.

Signed and Sealed this

Fourth Day of November, 2003

JAMES E. ROGAN
*Director of the United States Patent and Trademark Office*